(12) United States Patent  
Chang et al.

(10) Patent No.: US 8,711,132 B2  
(45) Date of Patent: Apr. 29, 2014

(54) DISPLAY PANEL AND GATE DRIVING CIRCUIT AND DRIVING METHOD FOR GATE DRIVING CIRCUIT

(75) Inventors: Chun-Huan Chang, Hsin-Chu (TW); Wan-Jung Chen, Hsin-Chu (TW); Yu-Chung Yang, Hsin-Chu (TW)

(73) Assignee: Au Optronics Corp., Hsin-Chu (TW)

( * ) Notice: Subject to any disclaimer, the term of this patent is extended or adjusted under 35 U.S.C. 154(b) by 284 days.

(21) Appl. No.: 13/363,458

(22) Filed: Feb. 1, 2012

(65) Prior Publication Data

US 2012/0320021 A1    Dec. 20, 2012

(30) Foreign Application Priority Data

Jun. 17, 2011   (TW) ............................. 100121270 A (51) Int. Cl.
*G06F 3/038* (2013.01)
(52) U.S. Cl.
USPC .......................................... 345/204; 345/214
(58) Field of Classification Search
None
See application file for complete search history.

(56) References Cited

U.S. PATENT DOCUMENTS

| 7,817,771 | B2 | 10/2010 | Tsai et al. |
| 2003/0090614 | A1 | 5/2003 | Kim et al. |
| 2005/0078076 | A1 | 4/2005 | Kim et al. |
| 2006/0022912 | A1 | 2/2006 | Park et al. |
| 2008/0001899 | A1 | 1/2008 | Chan et al. |
| 2008/0246038 | A1 | 10/2008 | Um et al. |
| 2009/0027581 | A1 | 1/2009 | You et al. |
| 2010/0245301 | A1* | 9/2010 | Shang ........................... 345/204 |
| 2010/0260312 | A1 | 10/2010 | Tsai et al. |
| 2011/0115998 | A1 | 5/2011 | Liao et al. |
| 2011/0148830 | A1 | 6/2011 | Hsu et al. |
| 2011/0181804 | A1 | 7/2011 | You et al. |
| 2012/0081346 | A1* | 4/2012 | Furuta et al. .................. 345/209 |
| 2012/0092311 | A1* | 4/2012 | Ohkawa et al. .............. 345/204 |

FOREIGN PATENT DOCUMENTS

| CN | 1561469 | 1/2005 |
| CN | 1601596 | 3/2005 |
| CN | 101354512 | 1/2009 |
| CN | 101819365 | 9/2010 |
| TW | 201123149 | 7/2011 |

OTHER PUBLICATIONS

Taiwan Patent Office, "Office Action", Oct. 24, 2013.

* cited by examiner

*Primary Examiner* — Adam R Giesy
(74) *Attorney, Agent, or Firm* — WPAT, PC; Justin King (57) ABSTRACT

An exemplary gate driving circuit is adapted for driving a display panel including multiple pixels and includes a first gate driving unit string and a second gate driving unit string. The first gate driving unit string includes multiple cascade-connected first gate driving units and receives a start pulse. The first gate driving units are for generating output pulses to drive the pixels. The second gate driving unit string includes multiple cascade-connected second gate driving units and receives the start pulse. The second gate driving units are for generating output pulses to drive the pixels. The output pulse generated from one of the second gate driving units is provided to one of first gate driving units to determine whether to disable the output pulse of the first gate driving unit which receives the output pulse generated from the second gate driving units.

20 Claims, 12 Drawing Sheets

DISPLAY PANEL AND GATE DRIVING CIRCUIT AND DRIVING METHOD FOR GATE DRIVING CIRCUIT

TECHNICAL FIELD

The disclosure relates to display technology, and more particularly to a display panel, a gate driving circuit and a driving method for gate driving circuit.

BACKGROUND

In present, because of high image quality, small size, light weight, wide application range and so on, flat panel displays such as liquid crystal displays (LCDs) are broadly employed in mobile phones, notebook computers, desktop computers, televisions and other consumer electronic products, and gradually replace traditional cathode ray tube (CRT) displays to become mainstream displays.

Figure 1A:
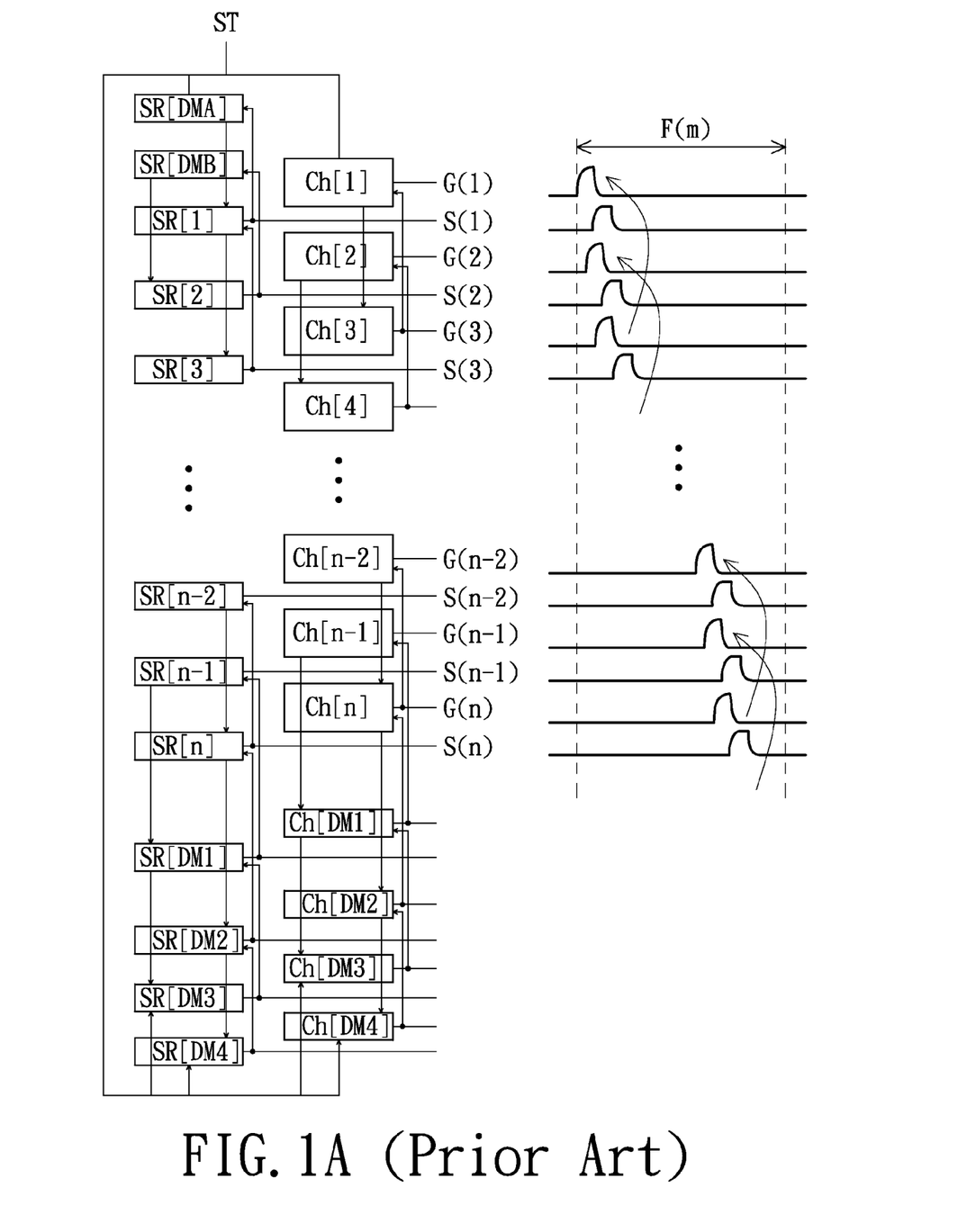
FIG. 1A is a schematic configuration of a conventional gate driving circuit employed by a display panel with charging and sharing pixel structure and waveforms of driving pulses outputted from the gate driving circuit in a single frame F(m).
Figure 1B:
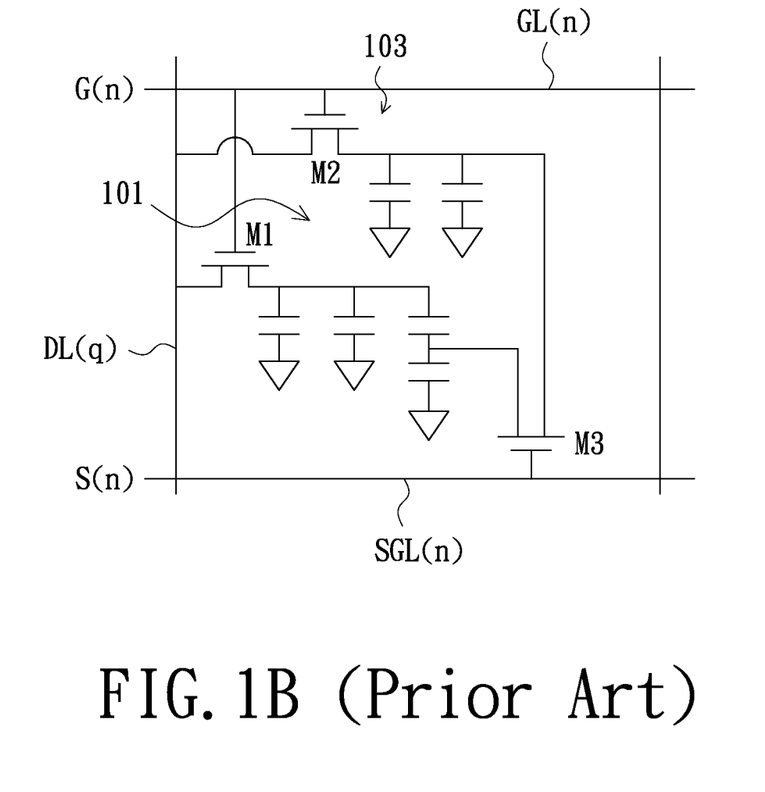
FIG. 1B is a schematic circuit diagram of a conventional single pixel with charging and sharing structure.

Referring to FIGS. 1A and 1B, FIG. 1A is a schematic configuration of a gate driving circuit employed in a display panel with charge sharing pixel structure and waveforms of driving pulses outputted from the gate driving circuit in a single frame F(m), and FIG. 1B is a schematic circuit diagram of a single pixel.

As shown in FIG. 1A, the gate driving circuit includes a charging gate driving unit string and a sharing gate driving unit string. The charging gate driving unit string includes cascade-connected charging gate driving units Ch[1]-Ch[n] and dummy charging gate driving units Ch[DM1]-Ch[DM4]. The sharing gate driving unit string includes cascade-connected delay sharing gate driving units SR[DMA]-SR[DMB], sharing gate driving units SR[1]-SR[n] and dummy sharing gate driving units SR[DM1]-SR[DM4]. The charging gate driving unit string receives a start pulse ST and generates output pulses stage by stage, thereby the charging gate driving units Ch[1]-Ch[n] sequentially output charging gate driving pulses G(1)-G(n) to determine whether corresponding pixels receive display data from data lines. When the sharing gate driving unit string receives the start pulse ST, the start pulse ST is firstly delivered by the delay sharing gate driving units SR[DMA]-SR[DMB], and then delivered to each of the sharing gate driving units SR[1]-SR[n] for sequentially outputting sharing gate driving pulses S(1)-S(n) to determine whether the corresponding pixels internally share charges.

Regarding multiple pixels driven by the charging gate driving unit string and the sharing gate driving unit string, as shown in FIG. 1B, each of the pixels includes a secondary sub-pixel 101 and a main sub-pixel 103. A pixel transistor M1 of the secondary sub-pixel 101 is electrically coupled to a gate line such as GL(n) and a data line such as DL(q) and thereby subjected to the control of a charging gate driving pulse G(n) to determine on-off states thereof. A pixel transistor M2 of the main sub-pixel 103 is electrically coupled to the same gate line GL(n) and the same data line DL(q) and thereby subjected to the control of the charging gate driving pulse G(n) to determine on-off states thereof. Furthermore, the pixel transistor M2 of the main sub-pixel 103 is electrically coupled to the secondary sub-pixel 101 via a sharing transistor M3. The sharing transistor M3 is electrically coupled to a sharing control line such as SGL(n) and thereby subjected to the control of a sharing gate driving pulse S(n) to determine on-off states thereof. Therefore, when the sharing transistor M3 is turned on, the secondary sub-pixel 101 and the main sub-pixel 103 mutually share for improving color washout phenomenon appeared under large viewing angle.

Referring again to FIG. 1A, each stage of the charging gate driving units for example the charging gate driving unit Ch[n−2] is subjected to the control of the charging gate driving pulse G(n) outputted from the second succeeding-stage charging gate driving unit Ch[n] thereof to determine the time of stopping outputting the charging gate driving pulse G(n−2). However, the backward-extended wire for delivering the charging gate driving pulse G(n) from the charging gate driving unit Ch[n] to the charging gate driving unit Ch[n−2] is arranged crossing multiple stages of charging gate driving unit and sharing gate driving unit, which not only needs excessively much wire layout space but also consumes much power. Furthermore, the increase of parasitic resistance and capacitance caused by the backward-extended wire would deteriorate the output waveform of the current stage charging gate driving unit Ch[n−2].

SUMMARY OF DISCLOSURE

Accordingly, a gate driving circuit in accordance with an embodiment is adapted for a display panel including multiple pixels. The gate driving circuit includes a first gate driving unit string and a second gate driving unit string. The first gate driving unit string includes multiple cascade-connected first gate driving units and receives a start pulse. The first gate driving units are configured (i.e., structured and arranged) for generating output pulses to drive the pixels, and the pixel driven by one of the first gate driving units is different from the pixels driven by the others of the first gate driving units. The second gate driving unit string includes multiple cascade-connected second gate driving units and receives the start pulse. The second gate driving units are configured for generating output pulses to drive the pixels, and the pixel driven by one of the second gate driving units is different from the pixels driven by the others of the second gate driving units. The output pulse generated from one of the second gate driving units is provided to one of first gate driving units to determine whether to disable the output pulse of the first gate driving unit which receives the output pulse generated from the second gate driving units.

A display panel in accordance with another embodiment includes multiple data lines, multiple gate lines disposed crossing over the data lines, multiple sharing control lines disposed next to the respective gate lines, multiple pixels, a first gate driving unit string and a second gate driving unit string. Each pixel is electrically coupled to one of the data lines, one of the gate lines and one of the sharing control lines. The multiple gate lines are configured for controlling corresponding pixels whether to receive data from corresponding data lines. The multiple sharing control lines are configured for controlling the corresponding pixels whether to share charges in the corresponding pixels respectively. The first gate driving unit string includes multiple cascade-connected first gate driving units and receives a start pulse, the first gate driving units are configured for generating driving pulses, and each of the first gate driving units is electrically coupled to one of the gate lines. The second gate driving unit string includes multiple cascade-connected second gate driving units and receives the start pulse, the second gate driving units are configured for generating driving pulses, and each of the second gate driving units is electrically coupled to one of the sharing control lines. The driving pulse generated from one of the second gate driving units is provided to one of first gate driving units to determine whether to disable the driving pulse of the first gate driving unit which receives the output pulse generated from the second gate driving unit.

A driving method in accordance with still another embodiment is adapted for a gate driving circuit including a first gate driving unit string and a second gate driving unit string. The first gate driving unit string includes multiple cascade-connected first gate driving units, and the second gate driving unit string includes multiple cascade-connected second gate driving units. The driving method includes the following steps of: enabling one of the first gate driving units to output a charging gate driving pulse for driving a first pixel to be charged; enabling one of the second gate driving units to output a sharing gate driving pulse; and providing the sharing gate driving pulse to the enabled first gate driving unit to switch the enabled first gate driving unit from an enabling state to a disabling state.

BRIEF DESCRIPTION OF THE DRAWINGS

The above embodiments of the disclosure will become more readily apparent to those ordinarily skilled in the art after reviewing the following detailed description and accompanying drawings.

DETAILED DESCRIPTION OF EMBODIMENTS

The disclosure will now be described more specifically with reference to the following embodiments. It is to be noted that the following descriptions of embodiments are presented herein for purpose of illustration and description only. It is not intended to be exhaustive or to be limited to the precise form disclosed.

Figure 2:
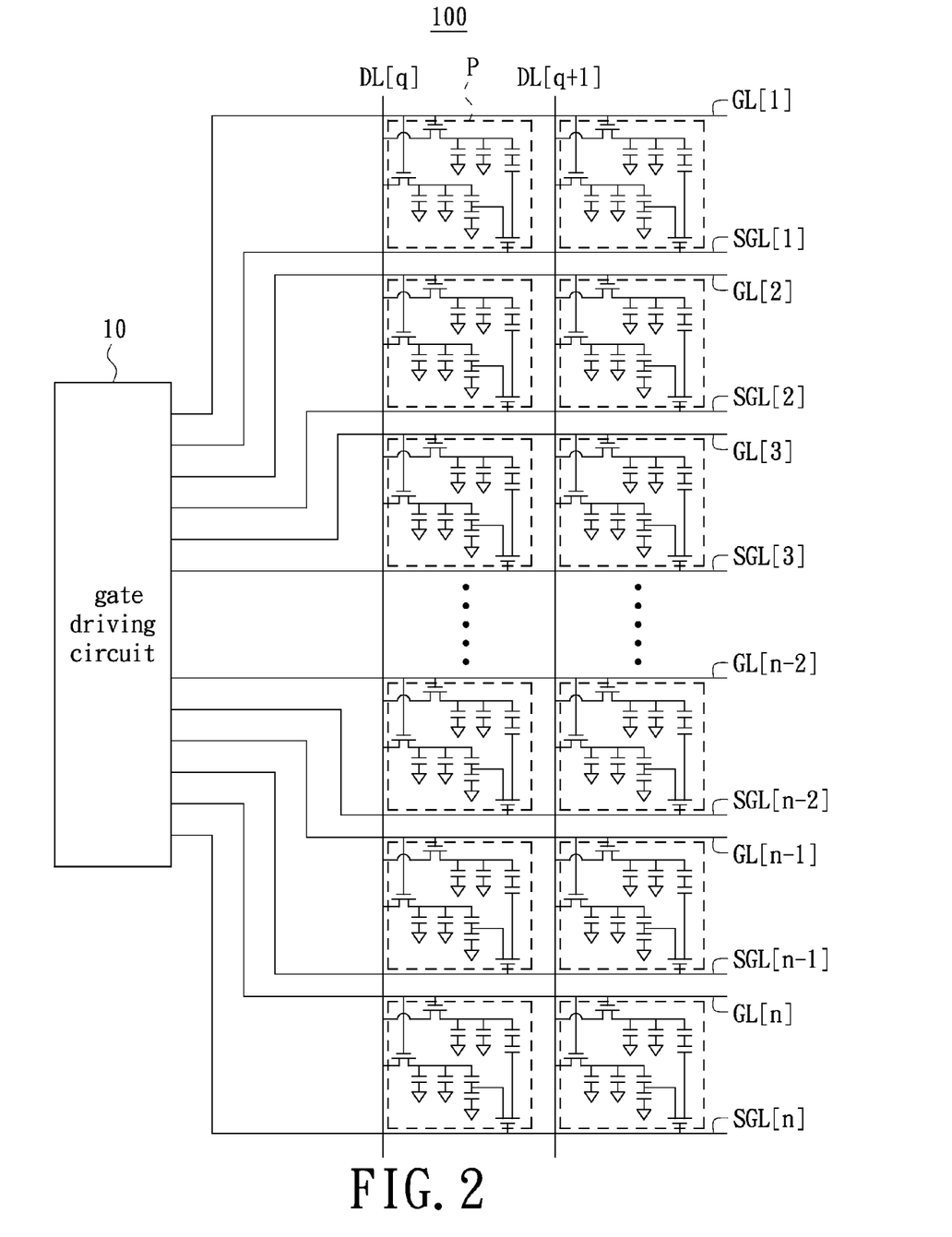
FIG. 2 is a schematic partial structure view a display panel according to an embodiment of the disclosure.

Referring to FIG. 2, FIG. 2 is a schematic partial structure view of a display panel according to an embodiment. In the illustrated embodiment, the display panel 100 may be a liquid crystal display panel or other kind of active-driven display panel, and includes a gate driving circuit 10, multiple pixels P, multiple data lines such as DL[q] and DL[q+1], multiple gate lines GL[1]-GL[n] and multiple sharing control lines SGL[1]-SGL[n]. Each of the data lines DL[q] and DL[q+1] is used to provide display data to corresponding pixels P. Each of the gate lines GL[1]-GL[n] is electrically coupled to the gate driving circuit 10 and disposed crossing over the data lines DL[q] and DL[q+1]. Each of the sharing control lines SGL[1]-SGL[n] is electrically coupled to the gate driving circuit 10 and disposed in next to the respective gate lines GL[1]-GL[n]. Each of the pixels P is electrically coupled to one of the data lines DL[q] and DL[q+1], one of the gate lines GL[1]-GL[n] and one of the sharing control lines SGL[1]-SGL[n] to determine whether to receive the display data from the corresponding data line by the corresponding gate line and determine whether to internally share charges in the pixel by the corresponding sharing control line. Each of the pixels P includes multiple e.g., two sub-pixels mutually sharing charges. The circuit configuration of the two sub-pixels of each pixel P can refer to the description associated with FIG. 1B and thus will not be repeated herein.

Figure 3A:
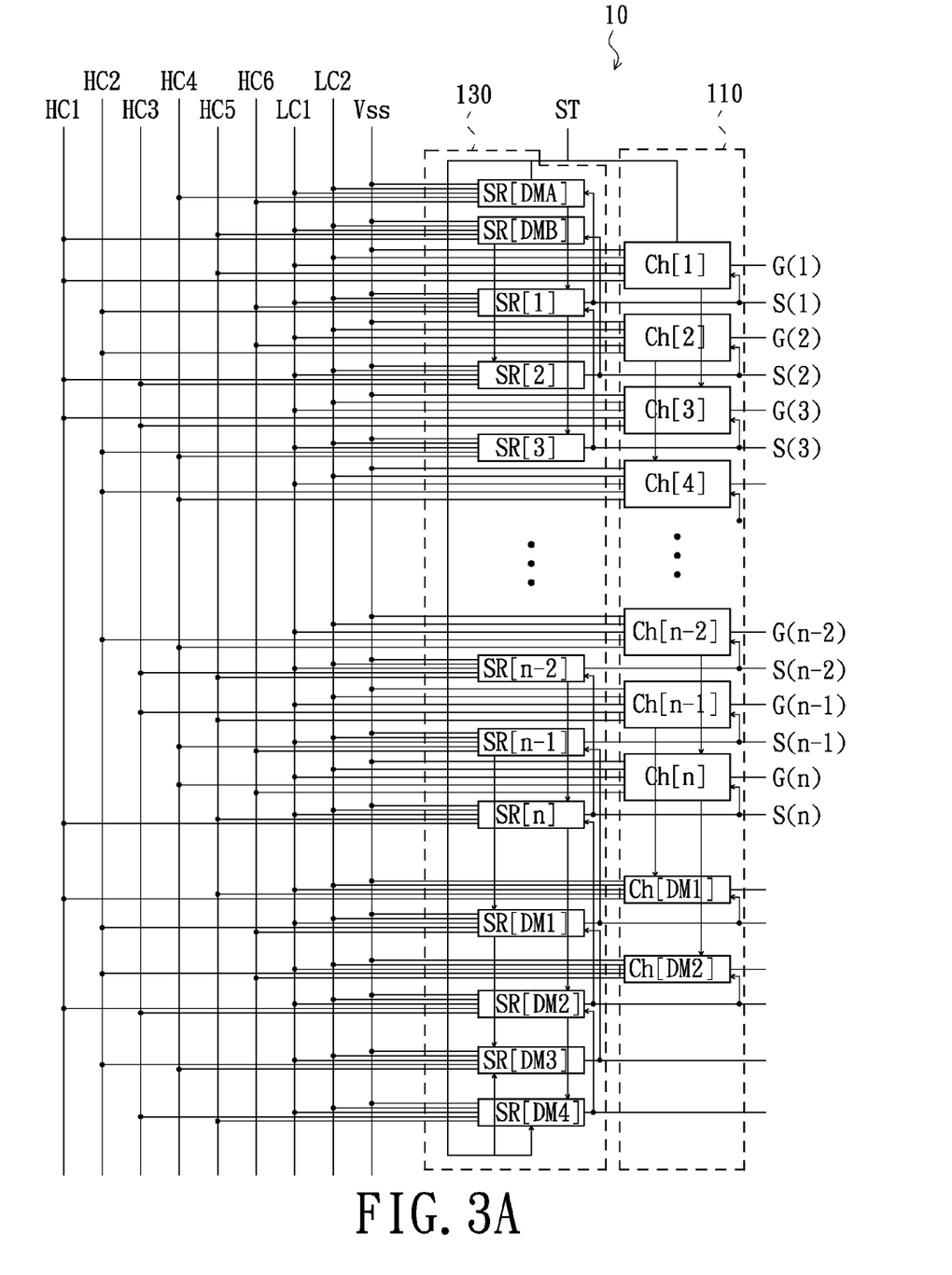
FIG. 3A is a schematic configuration of a gate driving circuit of the display panel of FIG. 2 according to an embodiment.
Figure 3B:
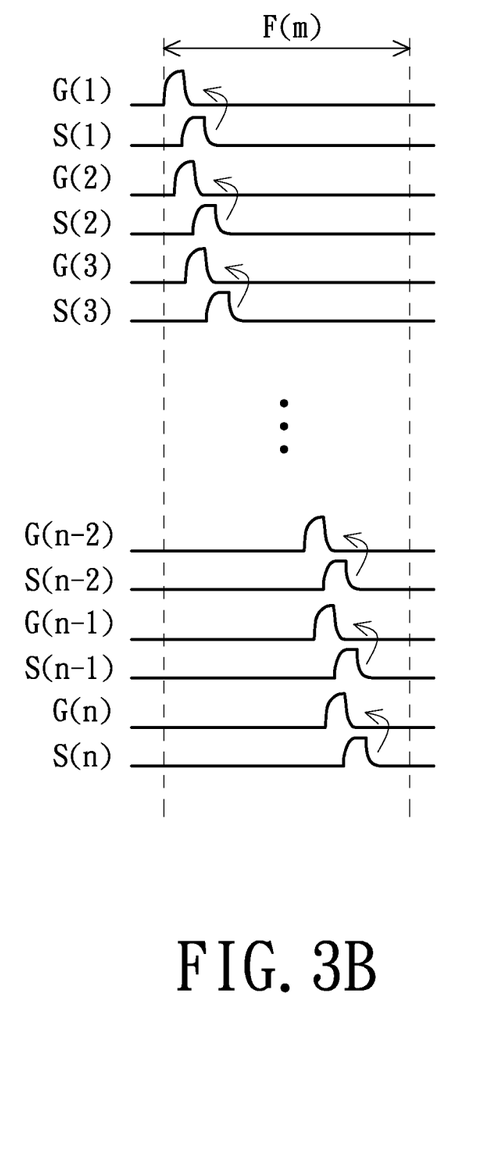
FIG. 3B is schematic waveforms of driving pulses outputted from the gate driving circuit of FIG. 3A in a single frame F(m).
Figure 3C:
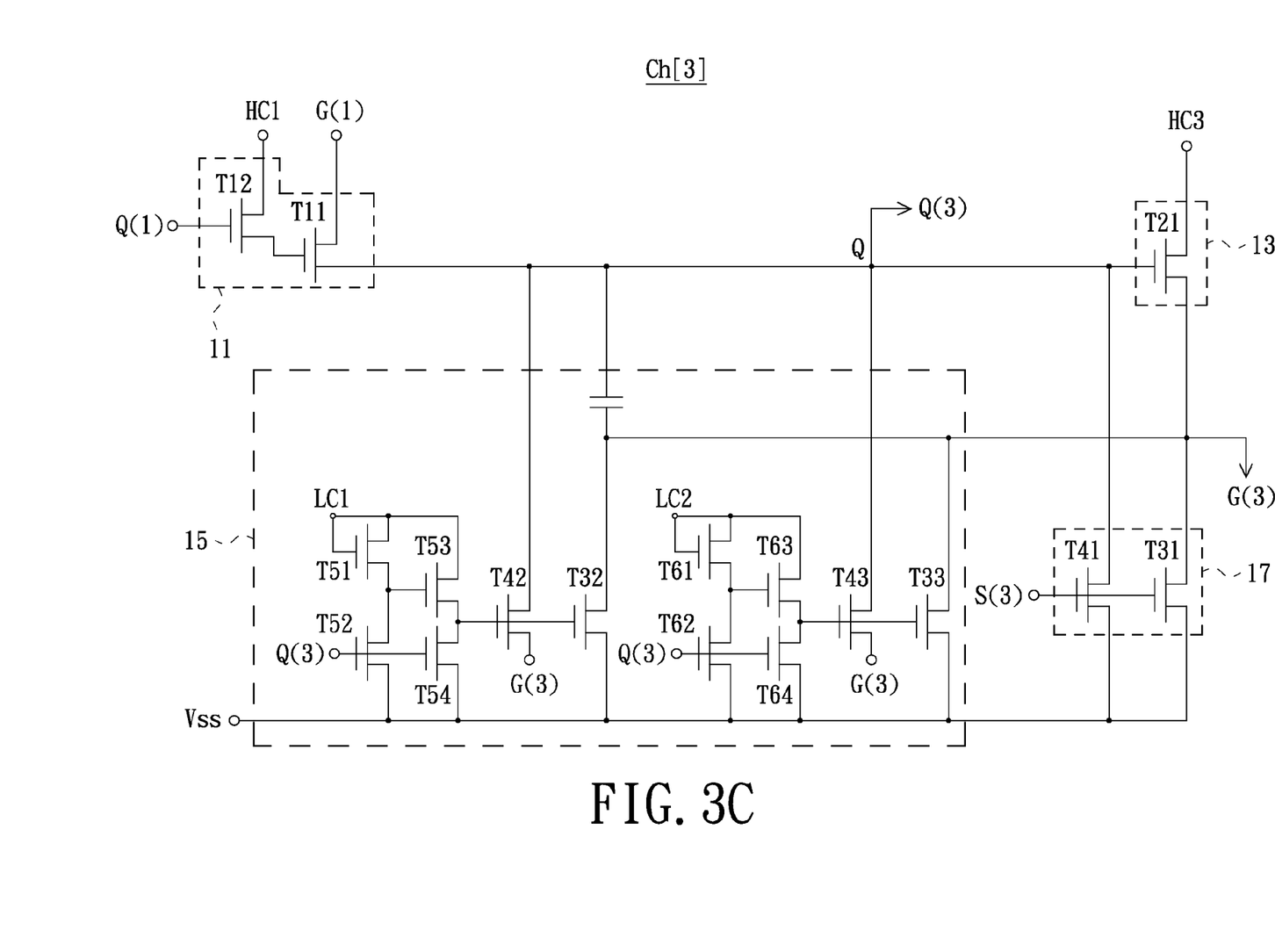
FIG. 3C is a schematic detailed circuit diagram of a single charging gate driving unit in FIG. 3A.
Figure 3D:
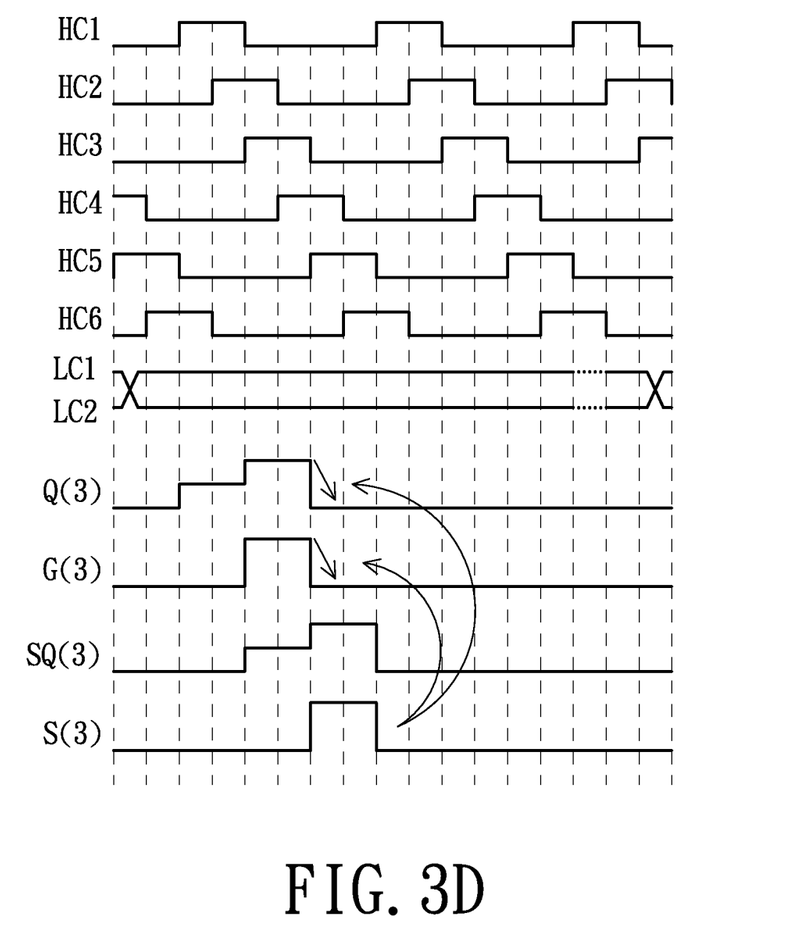
FIG. 3D is schematic waveforms of signals relevant to the gate driving circuit of FIG. 3C.

Referring to FIGS. 3A through 3D, FIG. 3A is a schematic configuration of the gate driving circuit 10 of the display panel 100 in FIG. 2 according to an embodiment, FIG. 3B is schematic waveforms of driving pulses outputted from the gate driving circuit 10 in a single frame F(m), FIG. 3C is a schematic detailed circuit diagram of a single charging gate driving unit in FIG. 3A, and FIG. 3D is schematic waveforms of multiple signals relevant to the gate driving circuit of FIG. 3C.

As shown in FIG. 3A, the gate driving circuit 10 includes a charging gate driving unit string 110 (namely, a first gate driving unit string) and a sharing gate driving unit string 130 (namely, a second gate driving unit string). The charging gate driving unit string 110 includes charging gate driving units Ch[1]-Ch[n] and dummy charging gate driving units Ch[DM1]-Ch[DM2] all connected in cascade. The charging gate driving unit string 110 receives a start pulse ST and generates output pulses stage by stage so that the charging gate driving units Ch[1]-Ch[n] sequentially output charging gate driving pulses G(1)-G(n) to control whether the corresponding pixels P receive the display data from the corresponding data lines. Moreover, the charging gate driving unit string 110 receives high frequency clock signals e.g., HC1, HC2, HC3, HC4, HC5, HC6 and low frequency clock signals e.g., LC1, LC2. Each of the charging gate driving units Ch[1]-Ch[n] and dummy charging gate driving units Ch[DM1]-Ch[DM2] receives two of the high frequency clock signals e.g., HC1, HC3 (or HC2, HC4; or HC3, HC5; or HC4, HC6; or HC1, HC5; or HC2, HC6) and the low frequency clock signals LC1, LC2.

The sharing gate driving unit string 130 includes delay sharing gate driving units SR[DMA]-SR[DMB], sharing gate driving units SR[1]-SR[n] and dummy sharing gate driving units SR[DM1]-SR[DM4] all connected in cascade. When the sharing gate driving unit string 130 receives the start pulse ST, the start pulse ST is firstly transferred by the delay sharing gate driving units SR[DMA]-SR[DMB], and then generates output pulses transferred to the sharing gate driving units SR[1]-SR[n] stage by stage so that the sharing gate driving units SR[1]-SR[n] sequentially output sharing gate driving pulses S(1)-S(n) respectively to the sharing control lines SGL[1]-SGL[n] to control whether the corresponding pixels P internally share charges. Moreover, the sharing gate driving unit string 130 also receives the high frequency clock signals e.g., HC1, HC2, HC3, HC4, HC5, HC6 and the low frequency clock signals e.g., LC1, LC2. Each of the delay sharing gate driving units SR[DMA]-SR[DMB], sharing gate driving units SR[1]-SR[n] and dummy sharing gate driving units SR[DM1]-SR[DM4] receives two of the high frequency clock signals e.g., HC1, HC3 (or HC2, HC4; or HC3, HC5; or HC4, HC6; or HC1, HC5; or HC2, HC6) and the low frequency clock signals LC1, LC2.

With regard to one of the charging gate driving units e.g., Ch[n] and one of the sharing gate driving units e.g., SR[n] for driving a same pixel P, the sharing gate driving pulse S(n) outputted from the sharing gate driving unit SR[n] is provided to the charging gate driving unit Ch[n] to determine whether to disable the charging gate driving pulse G(n) outputted from the charging gate driving unit Ch[n], that is, to determine whether to stop charging so as to carry out charge sharing. In this embodiment, the gate line and the sharing control line respectively controlled by the charging gate driving unit and the sharing gate driving unit for driving the same pixel P are disposed at two sides of the pixel P and neighboring with each other. It can be found from the waveform diagram of FIG. 3B, effective times of the charging gate driving pulse such as G(n) and the sharing gate driving pulse S(n) for driving the same pixel P are not overlapped with each other, while effective times of two neighboring charging gate driving pulses such as G(n−1) and G(n) are partly overlapped with each other, for example overlapped with 50%, and effective times of two neighboring sharing gate driving pulses such as S(n−1) and S(n) also are partly overlapped with each other. It is indicated that, the waveforms of each of the charging gate driving pulses G(1)-G(n) and each of the sharing gate driving pulses S(1)-S(n) in FIG. 3B are simulated waveforms obtained under the situation of the effect of internal circuits of the gate driving circuit 10 being in consideration, while ideally, each of the waveforms of the driving pulses G(1)-G(n) and S(1)-S(n) is an ideal square wave.

As shown in FIG. 3C, in the charging gate driving unit string 110, any one of the charging gate driving units Ch[1]-Ch[n] and dummy charging gate driving units Ch[DM1]-Ch[DM2] such as Ch[3] includes an enable control circuit 11, a pull-up circuit 13, a stabilizing circuit 15 and a pull-down circuit 17. The enable control circuit 11 is used to enable the pull-up circuit 13 and may include two transistors T11 and T12 connected in cascade. The gate of the transistor T12 receives an enabling voltage signal for example the voltage signal Q(1) at a node Q of the second preceding-stage charging gate driving unit Ch[1], the source/drain of the transistor T12 receives the high frequency clock signal HC1. The gate of the transistor T11 is electrically coupled to the drain/source of the transistor T12, the source/drain of the transistor T11 receives the charging gate driving pulse G(1) outputted from the second preceding-stage charging gate driving unit Ch[1], and the drain/source of the transistor T11 is electrically coupled the node Q of the charging gate driving unit Ch[3]. In short, the enable control circuit 11 receives the signals Q(1) and G(1) outputted from the second preceding-stage charging gate driving unit Ch[1] and the high frequency clock signal HC1 to thereby generate an enabling voltage signal Q(3) at the node of the current-stage charging gate driving unit Ch[3]. It is understood that, the enable control circuit 11 may only include a single transistor instead. The pull-up circuit 13 is subjected to the control of the enabling voltage signal Q(3) to generate the charging gate driving pulse G(3) according to the high frequency clock signal HC3. The pull-up circuit 13 is for example includes a transistor T21. The gate of the transistor T21 is electrically coupled to the node Q of the charging gate driving unit Ch[3] and thereby the voltage signal Q(3) at the node Q of the charging gate driving unit Ch[3] determines whether to turn on the transistor T21, the source/drain of the transistor T21 receives another high frequency clock signal HC3, and the drain/source of the transistor T21 electrically coupled to the pull-down circuit serves as an output terminal of the charging gate driving pulse G(3). The stabilizing circuit 15 is used to stabilize the voltage at the node Q of the charging gate driving unit Ch[3] and the voltage of the drain/source of the transistor T21, and for example includes multiple transistors T32, T42, T51, T52, T53, T54, T33, T43, T61, T62, T63, T64 and a capacitor (not labeled). The transistors T32, T42, T51, T52, T53, T54 cooperatively constitute a first stabilizing unit, and the first stabilizing unit receives the low frequency clock signal LC1 and the signals Q(3), G(3) generated by the current-stage charging gate driving unit Ch[3]. The transistors T33, T43, T61, T62, T63, T64 cooperatively constitute a second stabilizing unit, and the second stabilizing unit receives the low frequency clock signal LC2 and the signals Q(3), G(3) generated by the current-stage charging gate driving unit Ch[3]. The pull-down circuit 17 for example includes transistors T31 and T41. The transistors T31, T41 both are subjected to the control of the sharing gate driving pulse S(3) outputted from the sharing gate driving unit SR[3] to pull the voltages respectively at the node Q and the drain/source of the transistor T21 down to a predetermined voltage level such as Vss in a particular time, that is, switching the charging gate driving pulse G(3) from an enabling state to a disabling state. Herein, it is indicated that, any one of the delay sharing gate driving units SR[DMA]-SR[DMB], sharing gate driving units SR[1]-SR[n] and dummy sharing gate driving units SR[DM1]-SR[DM4] may have the same detailed circuit configuration as that of the charging gate driving unit Ch[3] as illustrated in FIG. 3C, and thus will not be repeated, so that the signal at the node Q in SR[3] can be named as SQ(3).

As shown in FIG. 3D, schematic waveforms of the high frequency clock signals HC1-HC6, the low frequency clock signals LC1-LC2, the signals Q(3) and G(3) generated from the current-stage charging gate driving unit Ch[3], and the signals SQ(3) and S(3) outputted from the sharing gate driving unit SR[3] are illustrated. In this embodiment, the low frequency clock signals LC1, LC2 are mutually phase-inverted.

In comparing the charging gate driving unit string 110 of FIG. 3A according to the disclosure with that of FIG. 1A, each of the charging gate driving units in the charging gate driving unit string 110 such as Ch[3] uses the sharing gate driving pulse S(3) outputted from the sharing gate driving unit SR[3] in the sharing gate diving unit string 130 neighboring with the charging gate driving unit Ch[3] to enable the pull-down circuit 17 of the charging gate driving unit Ch[3], rather than uses the charging gate driving pulse G(5) outputted from the second succeeding-stage charging gate driving unit Ch[5] as a pull-down enabling pulse to enable the pull-down circuit of the charging gate driving unit Ch[3] as illustrated in FIG. 1A. Therefore, it is no longer necessary to arrange backward-extended wires crossing other stages of charging gate driving unit and sharing gate driving unit, the phenomenon of one backward-extended wire crossing multiple stages is avoided, the parasitic resistance and capacitance is decreased, the waveforms of charging gate driving pulses are improved and the whole power consumption is lowered and further the possibility of ESD damage is reduced. Moreover, the charging gate driving unit string 110 of the disclosure only needs two stages of dummy charging gate driving units, compared with the four stages of dummy charging gate driving units in FIG. 1A, the number of the dummy charging gate driving units is decreased and therefore the layout space is saved.

Figure 3E:
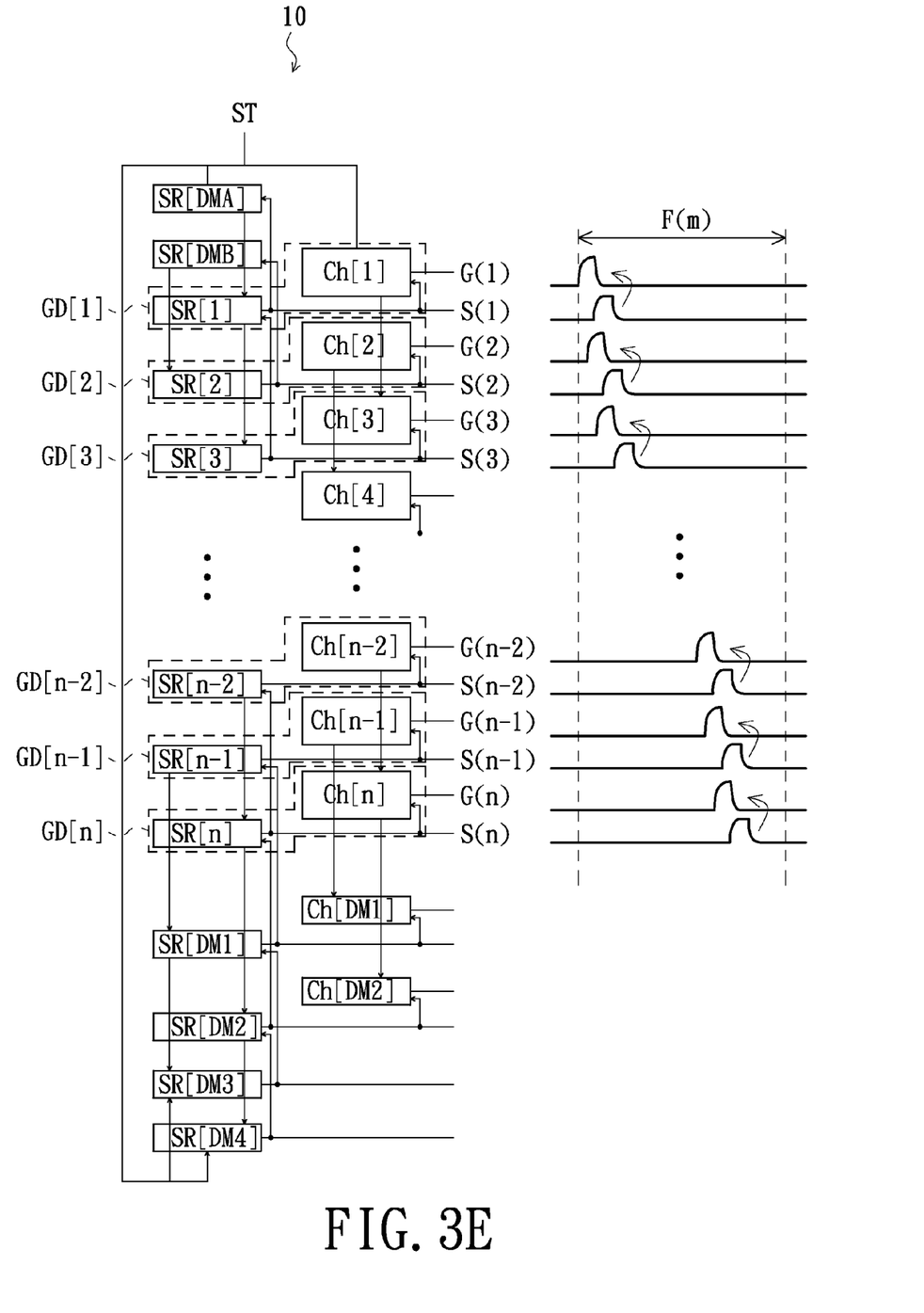
FIG. 3E is a schematic configuration of the gate driving circuit in FIG. 3A from another viewpoint.

Referring to FIG. 3E, FIG. 3E is a schematic configuration of the gate driving circuit 10 from another viewpoint. For the convenience of drawing, the clock signals HC1~CH6 and LC1~LC2 are omitted. As shown in FIG. 3E, the charging gate driving units Ch[1]-Ch[n] and the sharing gate driving units SR[1]-SR[n] of the gate driving circuit 10 cooperatively constitute multiple stages of gate drivers GD[1]-GD[n]. Each stage of the gate drivers GD[1]-GD[n] includes one charging gate driving unit e.g., Ch[3] and one sharing gate driving unit e.g., SR[3] for driving a same pixel P. In each stage of gate driver e.g., GD[3], the charging gate driving pulse e.g., G(3) outputted from the charging gate driving unit Ch[3] whether switched from an enabling state to an disabling state is determined by the sharing gate driving pulse S(3) outputted from the sharing gate driving unit SR[3] in the same stage of gate driver GD[3].

In the above embodiment, each gate line e.g., GL[3] controlled by the corresponding charging gate driving unit Ch[3] is controlled by the sharing gate driving unit SR[3] for driving the same pixel P (i.e., the sharing gate driving unit in the same stage of gate driver) to switch from the enabling state to the disabling state. Moreover, the same pixel P is enabled to perform charge sharing just after the charging gate driving pulse G(3) therefor is disabled. The disclosure is not limited to the above embodiment, a succeeding-stage sharing gate driving unit can be adopted instead to achieve the purpose of switching the gate line from the enabling state to the disabling state, as long as the condition of "a gate line whether switched from an enabling state to a disabling state is determined by a voltage on a sharing control line enabled after the gate line is enabled" is satisfied. For example, in the other embodiment of the disclosure, the sharing gate driving unit SR[4] may be used to control the gate line GL[3] controlled by the charging gate driving unit Ch[3] to be switched from an enabling state to an disabling state.

Figure 4A:
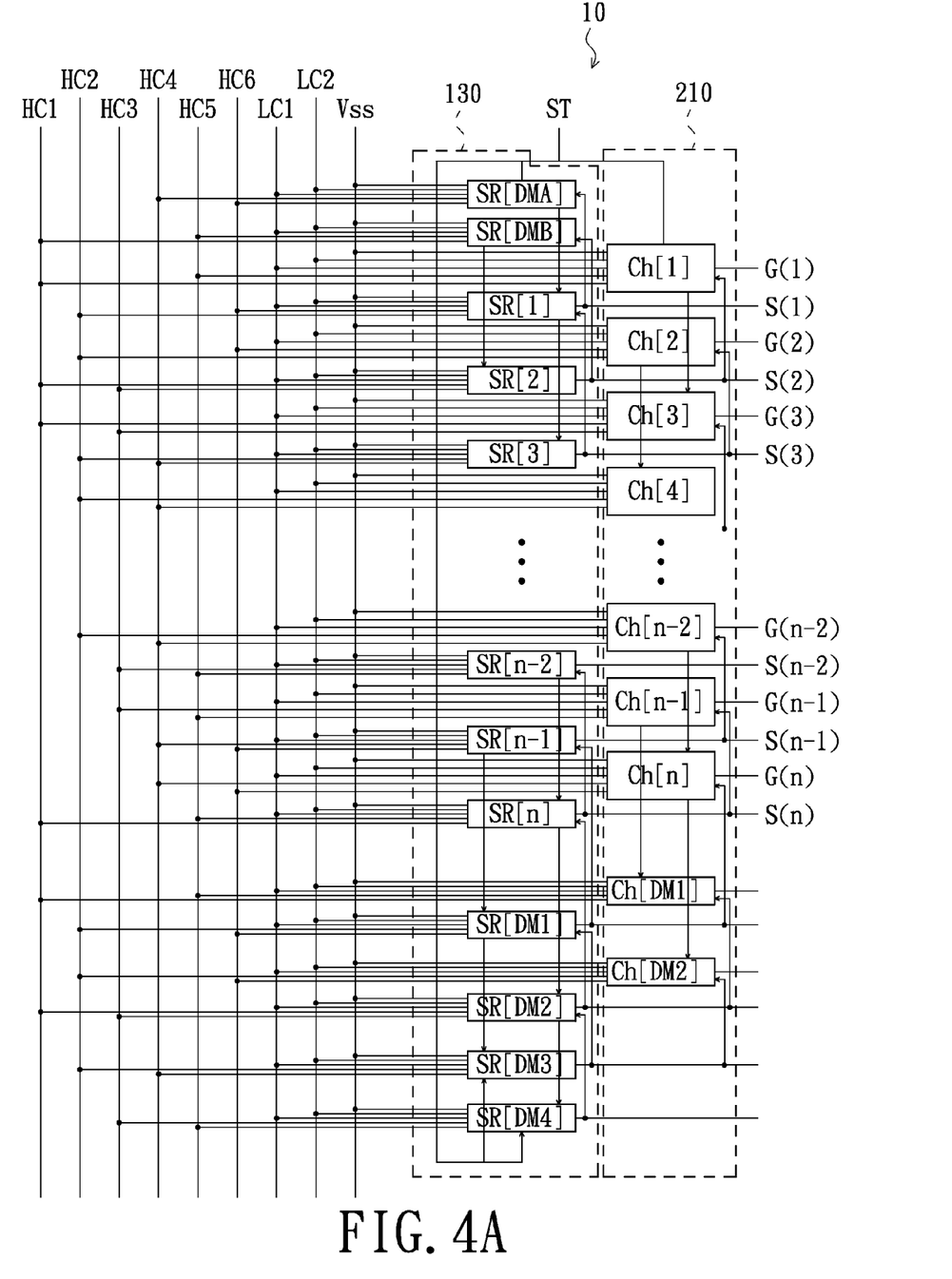
FIG. 4A is a schematic configuration of the gate driving circuit of the display panel of FIG. 2 according to another embodiment.
Figure 4B:
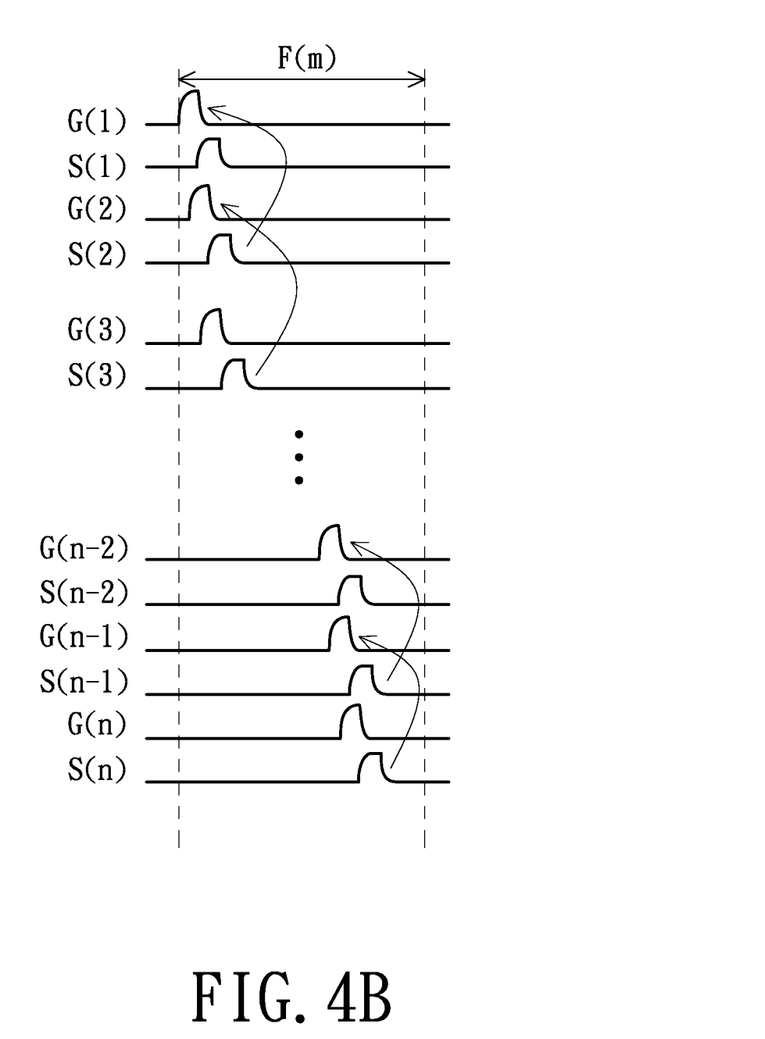
FIG. 4B is schematic waveforms of driving pulses outputted from the gate driving circuit of FIG. 4A in a single frame F(m).
Figure 4C:
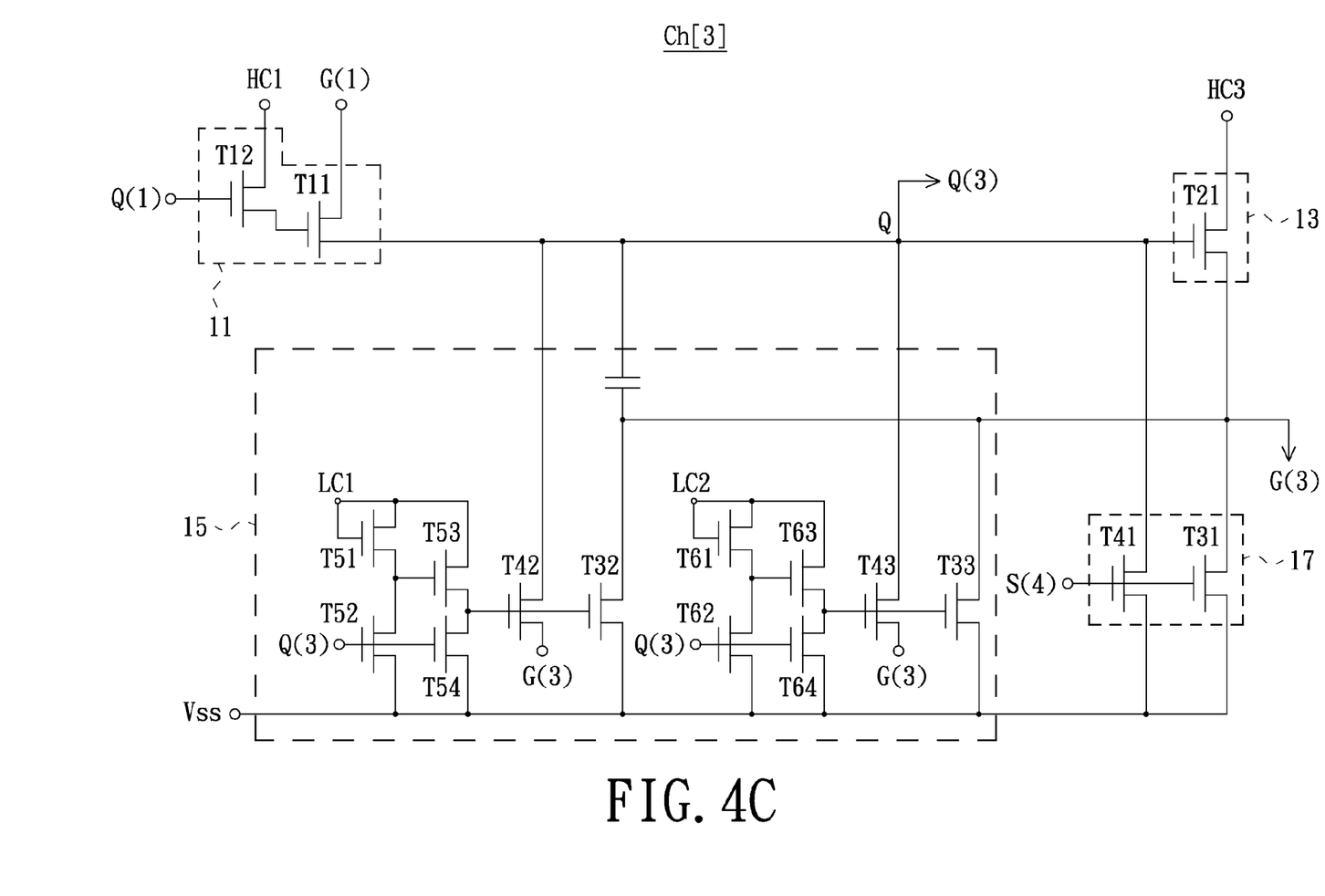
FIG. 4C is a schematic detailed circuit diagram of a single charging gate driving unit in FIG. 4A.

Referring to FIG. 2, FIG. 4A, FIG. 4B and FIG. 4C together, FIG. 4A is a schematic configuration of the gate driving circuit 10 of the display panel 100 in FIG. 2 according to another embodiment, FIG. 4B is schematic waveforms of driving pulses outputted from the gate driving circuit 10 in a single frame F(m), and FIG. 4C is a schematic detailed circuit diagram of a single charging gate driving unit in FIG. 4A. As shown in FIGS. 4A and 4B, the charging gate driving unit string 210, which is similar to the charging gate driving unit string 110 in FIG. 3A, includes charging gate driving units Ch[1]-Ch[n] and dummy charging gate driving units Ch[DM1]-Ch[DM2] connected in cascade, and the charging gate driving unit string 210 also receives the start pulse ST, the high frequency clock signals e.g., HC1~HC6 and the low frequency clock signals e.g., LC1, LC2. However, the difference is that each of the charging gate driving units Ch[1]-Ch[n] in the charging gate driving unit string 210 is disabled to output a pulse by using the sharing gate driving pulse outputted from the first succeeding-stage sharing gate driving unit relative to the sharing gate driving unit for driving the same pixel P as the charging gate driving unit. For example the illustration in FIG. 4C, the charging gate driving unit Ch[3] uses the sharing gate driving pulse S(4) outputted from the sharing gate driving unit SR[4] to enable the pull-down circuit 17 of the charging gate driving unit Ch[3] to thereby disable the output of the charging gate driving unit Ch[3]. In the illustrated embodiment, in the same frame F(m), the pixel P driven by the sharing gate driving unit SR[4] is driven later than the pixel P driven by the charging gate driving unit Ch[3].

Figure 4D:
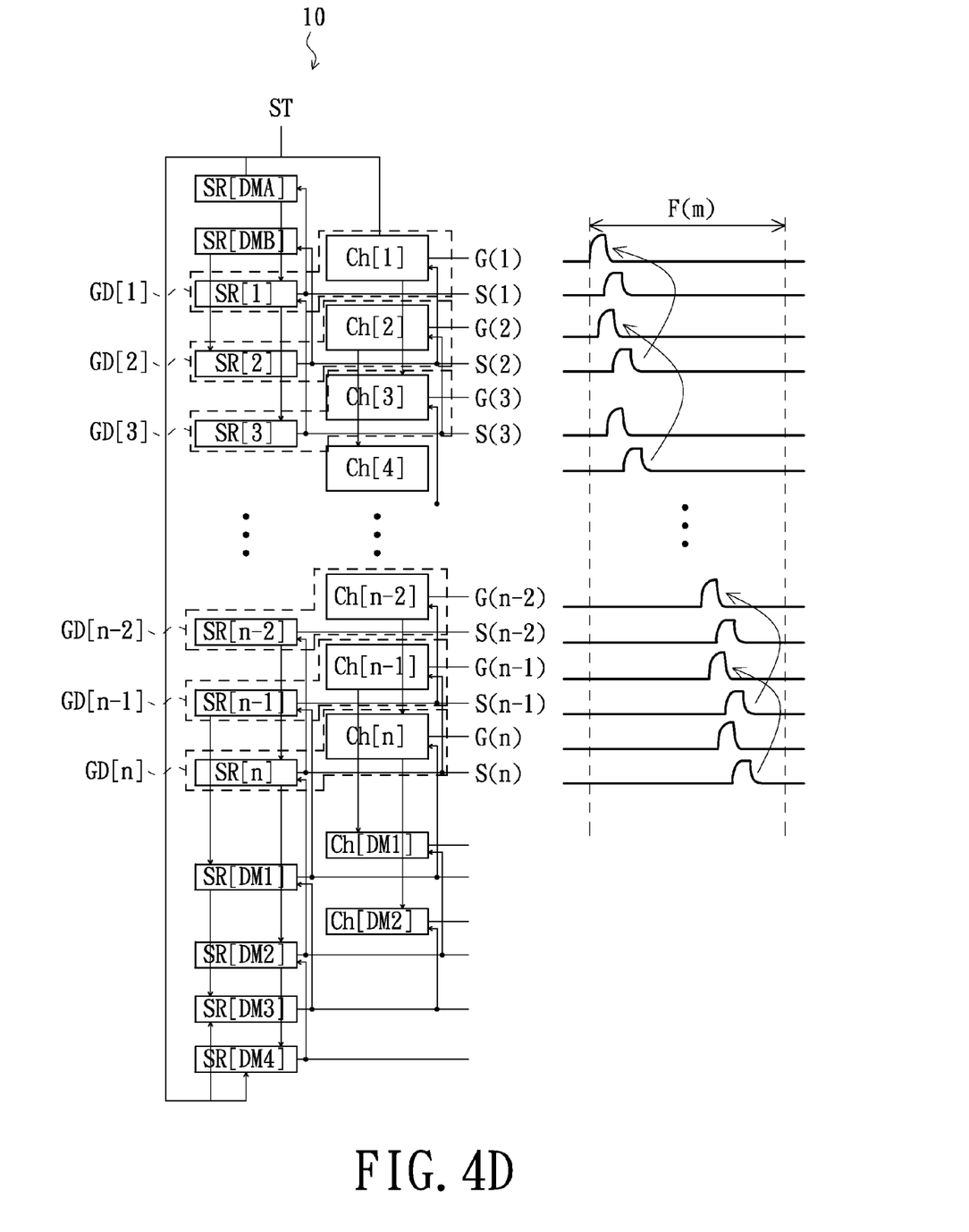
FIG. 4D is a schematic configuration of the gate driving circuit in FIG. 4A from another viewpoint.

Referring to FIG. 4D, FIG. 4D is the schematic configuration of the gate driving circuit 10 from another viewpoint according to the embodiment shown in FIG. 4A. For the convenience of drawing, the clock signals HC1~HC6 and LC1~LC2 are omitted. As shown in FIG. 4D, the charging gate driving units Ch[1]-Ch[n] and the sharing gate driving units SR[1]-SR[n] of the gate driving circuit 10 cooperatively constitute multiple stages of gate drivers GD[1]-GD[n]. Each stage of the gate drivers includes one charging gate driving unit e.g., Ch[3] and one sharing gate driving unit e.g., SR[3] for driving a same pixel P. Moreover, in each stage of gate driver e.g., GD[3], the charging gate driving pulse e.g., G(3) outputted from the charging gate driving unit Ch[3] whether switched from an enabling state to a disabling state is controlled by the sharing gate driving pulse e.g., S(4) outputted from the sharing gate driving unit SR[4] in the first succeeding-stage gate driver GD[4] (not labeled).

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A gate driving circuit, adapted for driving a display panel comprising a plurality of pixels, comprising:
    a first gate driving unit string, wherein the first gate driving unit string comprises a plurality of cascade-connected first gate driving units and receives a start pulse, the first gate driving units are for generating output pulses to drive the pixels, and the pixel driven by one of the first gate driving units is different from the pixels driven by the others of the first gate driving units; and
    a second gate driving unit string, wherein the second gate driving unit string comprises a plurality of cascade-connected second gate driving units and receives the start pulse, the second gate driving units are for generating output pulses to drive the pixels, and the pixel driven by one of the second gate driving units is different from the pixels driven by the others of the second gate driving units;
    wherein the output pulse generated from one of the second gate driving units is provided to one of first gate driving units to determine whether to disable the output pulse of the first gate driving unit which receives the output pulse generated from the second gate driving units.

2. The gate driving circuit according to claim 1, wherein the second gate driving unit generating the output pulse provided to the first gate driving to determine whether to disable the output pulse of the first gate driving and the first gate driving unit receiving the provided output pulse are configured to drive a same pixel.

3. The gate driving circuit according to claim 2, wherein the output pulses of the first gate driving units are configured to control the pixels for charging, and the output pulses of the second gate driving units are configured to control the pixels for sharing.

4. The gate driving circuit according to claim 1, wherein the pixel driven by the second gate driving unit generating the output pulse provided to the first gate driving to determine whether to disable the output pulse of the first gate driving is refreshed later than the pixel driven by the first gate driving unit receiving the provided output pulse in a same image frame.

5. The gate driving circuit according to claim 4, wherein the output pulses of the first gate driving units are configured to control the pixels for charging, and the output pulses of the second gate driving units are configured to control the pixels for sharing.

6. The gate driving circuit according to claim 1, wherein each of the first gate driving units and each of the second gate driving units for driving a same one of the pixels cooperatively constitute one stage gate driver so that the gate driving circuit comprises multi-stage gate drivers, and the second gate driving unit of each stage of the gate drivers provides the output pulse to the first gate driving unit of the same stage of the gate drivers.

7. The gate driving circuit according to claim 1, wherein each of the first gate driving units and each of the second gate driving units for driving a same one of the pixels cooperatively constitute one stage gate driver so that the gate driving circuit comprises multi-stage gate drivers, and the second gate driving unit of each stage of the gate drivers provides the output pulse to the first gate driving unit of a preceding-stage gate driver.

8. The gate driving circuit according to claim 1, wherein the output pulses of the first gate driving units are configured to control the pixels for charging, and the output pulses of the second gate driving units are configured to control the pixels for sharing.

9. The gate driving circuit according to claim 1, wherein each of the first gate driving units comprises: an enable control circuit, a pull-up circuit, a stabilizing circuit and a pull-down circuit; the pull-up circuit is subjected to the control of an enabling voltage at an input terminal of the pull-up circuit generated by the enable control circuit to generate the output pulse at an output terminal of the pull-up circuit according to a received first clock signal, the stabilizing circuit is for stabilizing voltages at the input terminal and the output terminal of the pull-up circuit, and the pull-down circuit is for pulling the voltages at the input terminal and the output terminal of the pull-up circuit down to a predetermined voltage level.

10. The gate driving circuit according to claim 9, wherein the enable control circuit comprises
a first transistor, the gate of the first transistor receives an enabling voltage at the input terminal of the pull-up circuit in the second preceding-stage first gate driving unit, and the drain/source of the first transistor receives a second clock signal phase-inverted to the first clock signal; and
a second transistor, the gate of the second transistor is electrically coupled to the source/drain of the first transistor, the drain/source of the second transistor receives the output pulse at the output terminal of the pull-up circuit in the second preceding-stage first gate driving unit, and the source/drain of the second transistor is electrically coupled to the input terminal of the pull-up circuit in the current-stage first gate driving unit.

11. The gate driving circuit according to claim 9, wherein the pull-up circuit comprises a third transistor, the gate of the third transistor electrically coupled to the enable control circuit serves as the input terminal, the drain/source of the third transistor receives the first clock signal, and the source/drain of the third transistor electrically coupled to the pull-down circuit serves as the output terminal.

12. The gate driving circuit according to claim 9, wherein the pull-down circuit comprises a fourth transistor and a fifth transistor; the gates of the fourth and fifth transistors both receive the output pulse from the second gate driving unit for disabling the output pulse of the current-stage first gate driving unit, the drain/source of the fourth transistor and the drain/source of the fifth transistor respectively electrically coupled to the input terminal and the output terminal of the pull-up circuit in the current-stage first gate driving unit, and the source/drain of the fourth transistor and the source/drain of the fifth transistor both are electrically coupled to the predetermined voltage level.

13. The gate driving circuit according to claim 9, wherein the stabilizing circuit comprises:
a first stabilizing unit, the first stabilizing unit is electrically coupled to the input terminal and the output terminal of the pull-up circuit in the current-stage first gate driving unit to receive the voltages at the input terminal and the output terminal and further receives a third clock signal with a lower frequency with respect to the first clock signal; and
a second stabilizing unit, the second stabilizing unit is electrically coupled to the input terminal and the output terminal of the pull-up circuit in the current-stage first gate driving unit to receive the voltages at the input terminal and the output terminal and further receives a fourth clock signal with a same frequency as the third clock signal, the fourth clock signal is phase-inverted to the third clock signal.

14. A display panel comprising:
a plurality of data lines;
a plurality of gate lines disposed crossing over the data lines;
a plurality of sharing control lines disposed next to the respective gate lines;
a plurality of pixels, wherein each pixel is electrically coupled to one of the data lines, one of the gate lines and one of the sharing control lines, and the plurality of gate lines are configured for controlling corresponding pixels whether to receive data from corresponding data lines, and the plurality of sharing control lines are configured for controlling the corresponding pixels whether to share charges in the corresponding pixels respectively;
a first gate driving unit string, wherein the first gate driving unit string comprises a plurality of first gate driving units connected in cascade and receives a start pulse, the first gate driving units are for generating driving pulses, and each of the first gate driving units is electrically coupled to one of the gate lines; and
a second gate driving unit string, wherein the second gate driving unit string comprises a plurality of second gate driving units connected in cascade and receives the start pulse, the second gate driving units are for generating driving pulses, and each of the second gate driving units is electrically coupled to one of the sharing control lines;
wherein the driving pulse generated from one of the second gate driving units is provided to one of first gate driving units to determine whether to disable the driving pulse of the first gate driving unit which receives the output pulse generated from the second gate driving unit.

15. The display panel according to claim 14, wherein the second gate driving unit generating the driving pulse to determine whether to disable the driving pulse of the first gate driving unit and the first gate driving unit receiving the provided driving pulse are configured to drive a same pixel.

16. The display panel according to claim 14, wherein the pixel driven by the second gate driving unit generating the driving pulse to determine whether to disable the driving pulse of the first gate driving unit is refreshed later than the pixel driven by the first gate driving unit receiving the provided driving pulse in a same image frame.

17. The display panel according to claim 14, wherein one of the sharing control lines is neighboring with the gate line whether being switched from an enabling state to a disabling state determined by a voltage on the sharing control line.

18. A driving method for a gate driving circuit, the gate driving circuit comprising a first gate driving unit string and a second gate driving unit string, the first gate driving unit string comprising a plurality of cascade-connected first gate driving units, and the second gate driving unit string comprising a plurality of cascade-connected second gate driving units, the driving method comprising:

enabling one of the first gate driving units to output a charging gate driving pulse for driving a first pixel to be charged;

enabling one of the second gate driving units to output a sharing gate driving pulse; and providing the sharing gate driving pulse to the enabled first gate driving unit to switch the enabled first gate driving unit from an enabling state to a disabling state.

19. The driving method according to claim 18, wherein the sharing gate driving pulse controls the first pixel to internally share charges.

20. The driving method according to claim 18, wherein the sharing gate driving pulse controls a second pixel to internally share charges, the second pixel being driven to be charged later than the first pixel in a same image frame.

* * * * *